United States Patent
Mieda

(10) Patent No.: US 7,397,303 B2
(45) Date of Patent: Jul. 8, 2008

(54) VACUUM TUBE CIRCUIT

(75) Inventor: Fumio Mieda, Tokyo (JP)

(73) Assignee: Korg, Inc., Tokyo (JP)

( * ) Notice: Subject to any disclaimer, the term of this patent is extended or adjusted under 35 U.S.C. 154(b) by 140 days.

(21) Appl. No.: 10/700,214

(22) Filed: Nov. 3, 2003

(65) Prior Publication Data

US 2007/0228988 A1    Oct. 4, 2007

(51) Int. Cl.
*H03G 3/00*    (2006.01)
(52) U.S. Cl. .................................. 330/127; 330/145
(58) Field of Classification Search ................ 330/127, 330/145, 139, 43
See application file for complete search history.

(56) References Cited

U.S. PATENT DOCUMENTS

| | | | | |
|---|---|---|---|---|
| 2,173,426 A | * | 9/1939 | Scott | 330/98 |
| 2,485,748 A | * | 10/1949 | Kucera | 379/35 |
| 2,580,875 A | * | 1/1952 | Young | 327/599 |
| 2,775,659 A | * | 12/1956 | Nelson | 330/70 |
| 2,890,295 A | * | 6/1959 | Murfin | 330/138 |
| 3,011,101 A | * | 11/1961 | Boyce Sr. et al. | 361/175 |

* cited by examiner

*Primary Examiner*—Henry K Choe
(74) *Attorney, Agent, or Firm*—Muramatsu & Associates

(57) ABSTRACT

A vacuum tube circuit is capable of amplifying an input signal with use of a low source voltage. Ordinarily, the amount of electrons released from a cathode which is heated by a heater is small since a voltage supplied to the heater is low. In the vacuum tube circuit disclosed here, a positive voltage is supplied to a grid terminal, which more effectively attracts the emitted electrons, thereby increasing the amount of electrons arriving at the plate terminal passing through the grid. As a result, a grid current and a plate current flow in the vacuum tube circuit, which achieves an operation for amplifying an input signal from a signal source.

13 Claims, 3 Drawing Sheets

VACUUM TUBE CIRCUIT

FIELD OF THE INVENTION

The present invention relates to a circuit for using a vacuum tube having a cathode, a plate, and a grid and provided with a heater for emitting electrons from the cathode, and more particularly, to a vacuum tube circuit which is able to amplify an input signal with use of a low source voltage and a positive grid voltage.

BACKGROUND OF THE INVENTION

Various circuits using an amplifying effect of a vacuum tube are proposed in various fields. Traditionally, in order to fulfill the amplifying effect of the vacuum tube, a rated voltage is supplied to a heater to flow a large current therethrough to emit electrons from the cathode of the vacuum tube. An amount of current flowing toward the plate of the vacuum tube caused by the emitted electrons is controlled by a negative voltage supplied to the grid terminal. In addition, in order to extract a large amount of controllable plate current, unlike the conventional controlling method of the vacuum tube, a method of supplying a positive voltage to the grid terminal has been proposed. Such a technology is disclosed, for example, by Japanese Patent Laid-Open Publication No. 59-66210, at pages 1-2 and FIG. 1.

According to the proposed technology, a larger amount of controllable plate current can be extracted by supplying a positive voltage to the grid terminal than the conventional method where a negative voltage is supplied to the grid terminal. However, in the proposed technology, in order to achieve an electron emission action, a rated voltage has to be supplied to the heater and a high voltage has to be supplied to the plate terminal. Thus, the vacuum tube circuit in the proposed technology consumes a relatively large amount of power.

SUMMARY OF THE INVENTION

It is, therefore, an object of the present invention to solve such a problem involved in the conventional technology, and to provide a vacuum tube circuit which is capable of amplifying an input signal with use of a low voltage.

It is another object of the present invention to provide a vacuum tube circuit with low voltage and low power consumption which fits to a battery operation.

It is a further object of the present invention to provide a vacuum tube circuit which can be implemented with high density, small size and with high reliability.

In order to achieve the above object, the vacuum tube circuit of the present invention is structured to supply a low source voltage to the plate terminal and the heater, as well as to supply a low positive voltage to the grid terminal through a resistor.

According to the present invention, by supplying the low positive voltage to the grid terminal through the resistor while supplying the low source voltage to the plate terminal and the heater, the vacuum tube circuit is capable of sufficiently amplifying an input signal.

In the present invention, the vacuum tube circuit can be so configured that the low source voltage is supplied to the plate terminal through a resister and to the heater. It can also be structured to include a bias control circuit so that an average value of the output voltage of the vacuum tube circuit is controlled to a predetermined value.

DETAILED DESCRIPTION OF THE INVENTION

The embodiments of the present invention will be described in detail below with reference to the accompanying drawings.

First Embodiment

Figure 1:
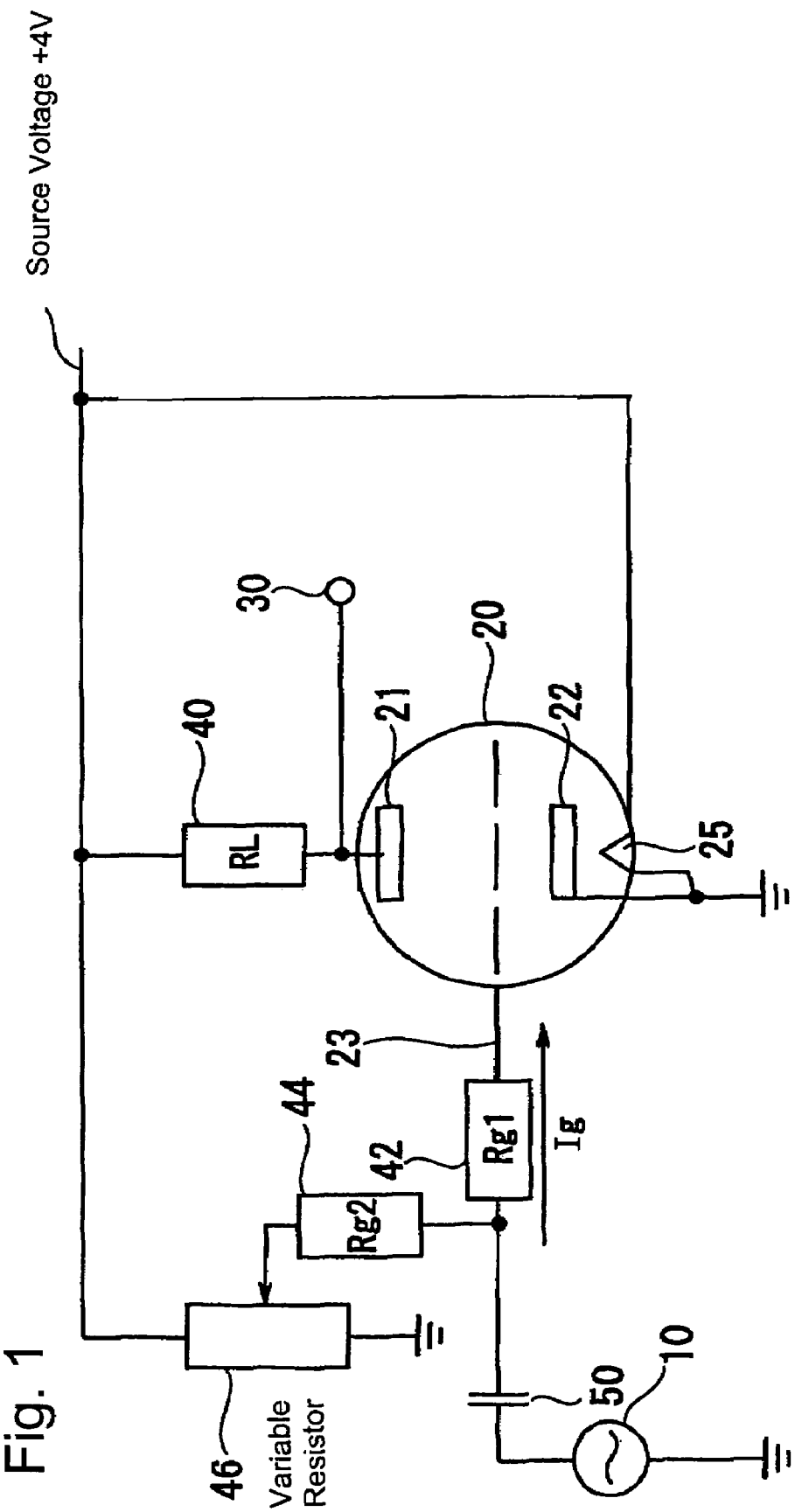
FIG. 1 is a circuit diagram showing an example of structure of the vacuum tube circuit in the first embodiment of the present invention.

FIG. 1 shows a configuration in the first embodiment of the vacuum tube circuit. In this example, a cathode terminal 22 of the vacuum tube 20 is connected to the ground, and a heater 25 for emitting the electrons from the cathode terminal 22 is provided with a low source voltage of +4V, for example. One end of a resistor (RL) 40 is connected to a plate terminal 21 of the vacuum tube 20 which receives the electrons emitted from the cathode 22. The source voltage +4V is also supplied to the other end of the resistor (RL) 40. Further, one end of a resistor (Rg1) 42 is connected to a grid terminal 23 of the vacuum tube 20.

A signal source 10 for generating an audio signal is connected to the other end of the resistor (Rg1) 42 through a capacitor 50. One end of a resistor (Rg2) 44 is also connected to the other end of the resistor (Rg1) 42. The other end of the register (Rg2) 44 is connected to a variable resistor (voltage divider) 46. The source voltage +4V is also supplied to the variable register 46. Therefore, the same low positive source voltage +4V is supplied to one end of the resistor (RL) 40 connected to the plate terminal 21, to the variable register 46, and to the heater 25. Consequently, the voltage at the plate terminal 21 becomes a low positive voltage as well. The low voltage based vacuum tube amplifier circuit of the present invention is configured as described above.

In the vacuum tube circuit of FIG. 1, the variable resistor 46 changes the resistance ratio by moving a connecting point of the resistor (Rg2) 44 by a moving unit (not shown), thereby changing a voltage level supplied to the resistor (Rg2) 44 from the source voltage +4V. Since the +4V source voltage is a positive voltage source, at any resistance ratio of the variable resistor 46, the grid terminal 23 of the vacuum tube 20 is always supplied with a positive voltage through the resistor (Rg2) 44 and the resistor (Rg1) 42.

The vacuum tube circuit of FIG. 1 operates as will be explained below. The electrons are released from the cathode terminal 22 which is heated by the heater 25. Since the voltage supplied to the heater 25 is lower than the normal vacuum tube, the amount of heat is small and thus, the amount of emission of the electrons from the cathode terminal 22 is also smaller than the normal case. Further, as noted above, the voltage supplied to the plate terminal 22 is low.

Accordingly, as in an ordinary vacuum tube circuit, if a negative voltage bias is applied to the grid terminal 23, the electrons emitted from the cathode terminal 22 are interfered by the grid terminal 23, making it difficult for them to reach the plate terminal 21. In the embodiment of the present invention, a positive voltage is supplied to the grid terminal 23, hence, a part of the electrons with a negative charge are able to reach the grid 23. Consequently, a grid current Ig, as shown in FIG. 1, flows through the resistor (Rg1) 42. Further, the electrons passing through a lattice of the grid 23 are accelerated to reach the plate terminal 21, thereby flowing a plate current through the resistor (RL) 40. As a result of this action, the vacuum tube 20 amplifies an input signal from the signal source 10. The grid current Ig increases when the electric potential of the grid increases.

Since the resistor (Rg1) 42 is connected, when the grid current Ig increases, a voltage across the resistor (Rg1) 42 also increases, which limits the voltage increase at the grid terminal 23. Thus, the voltage at the grid terminal 23 becomes, for example, about +1V. At the plate terminal 21 (output terminal 30), because of the voltage drop across the resistor (RL) 40 by the plate current, the output voltage is decreased to a low voltage of, for example, +1V.

Figure 3:
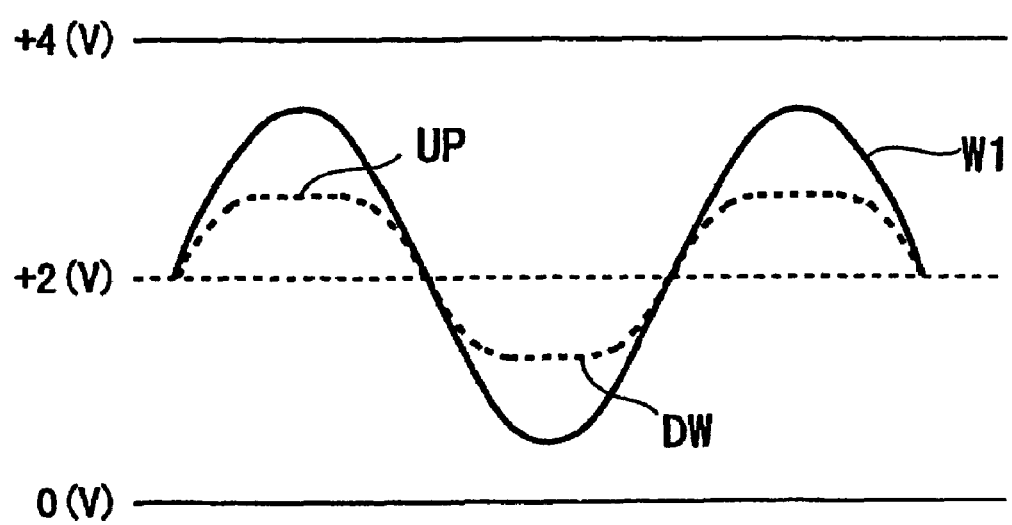
FIG. 3 is a timing chart showing waveforms for explaining the effect of the vacuum tube circuit of the present invention.

As a result, the vacuum tube 20 can function as an amplifier of low voltage and low power consumption. Further, in the vacuum tube amplifier, distortions on the top and bottom of the waveform can be produced in a symmetrical manner by a single vacuum tube, which is preferable as a special purpose amplifier such as for an electric guitar. A solid line of FIG. 3 shows a waveform W1 resulted from amplifying a sine wave signal from a signal source without distortion. A dotted line of FIG. 3 shows a waveform resulted from amplifying the sine wave signal by the vacuum tube circuit 20 of the present invention incorporating the distortions at the top and bottom of the waveform. The upper distortion UP on the waveform of the dotted line is created by the characteristic of the vacuum tube 20, and the lower distortion DW on the waveform is created by the voltage drop across the resistor (Rg1) 42.

As described in the forgoing, the vacuum tube circuit which is capable of amplifying an input signal with use of a low source voltage can be achieved by using a low positive voltage for the grid terminal 23 through the resistor (Rg1) 42 as well as using the low positive voltage to the plate terminal 21 and to the heater 25. As for the application, the low voltage based vacuum tube circuit 20 of the present invention can be advantageously applied to an audio signal amplifier for amplifying input signals of various music instruments or for adding unique sound effects based on the distortions noted above. It should be noted, however, that the application of the vacuum tube circuit of the present invention is not limited to such examples.

Second Embodiment

The second embodiment of the present invention is characterized by incorporating a bias control circuit which controls an output bias voltage so that the average value (bias voltage) of the amplified signal at the output terminal 30 becomes a predetermined level, for example, half of the voltage value of the source voltage.

Figure 2:
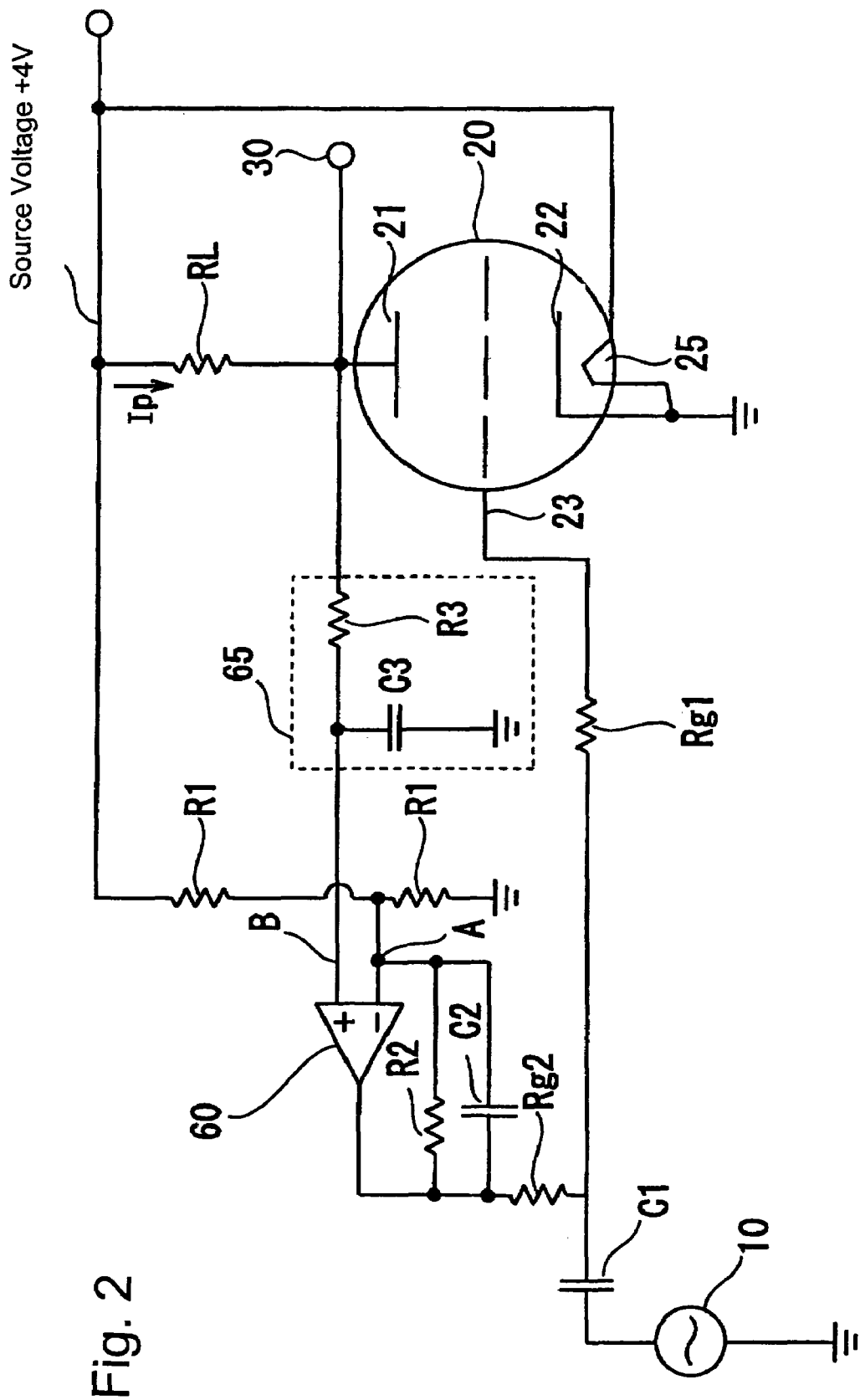
FIG. 2 is a circuit diagram showing an example of structure of the vacuum tube circuit in the second embodiment of the present invention.

FIG. 2 shows an example of circuit structure of the second embodiment in which the component identical to that of FIG. 1 is denoted by the same reference number. In this example, the cathode terminal 22 of the vacuum tube 20 is connected to the ground, and the heater 25 for emitting the electrons from the cathode terminal 22 is provided with a low source voltage of +4V, for example. One end of the resistor (RL) 40 is connected to the plate terminal 21 of the vacuum tube 20 which receives the electrons emitted from the cathode 22. The source voltage +4V is also supplied to the other end of the resistor (RL) 40. Further, one end of the resistor (Rg1) 42 is connected to the grid terminal 23 of the vacuum tube 20.

The signal source 10 for generating an audio signal is connected to the other end of the resistor (Rg1) 42 through the capacitor 50. One end of a resistor (Rg2) 44 is also connected to the other end of the resistor (Rg1) 42. In the second embodiment, an integration circuit 65 formed with a resistor R3 and a capacitor C3 is provided at the plate terminal 21, thereby averaging the plate voltage.

In addition, two resistors R1 having the same resistance value are series connected and the +4 (V) source voltage is supplied to one end of the two series connected resistors R1, where the other end thereof is connected to the grounded. The connection point of the two resistors R1 is connected to an inverting input terminal of a differential amplifier 60. As shown in FIG. 2, the integration circuit 65 is connected between the plate terminal 21 (output terminal 30) and a non-inverting input terminal of the differential amplifier 60. Also, a resistor R2 and a capacitor C2 are connected in a parallel fashion between the output terminal and the inverting input terminal of the differential amplifier 60. As is known in the art, the capacitor C2 and the differential amplifier 60 form an integrator to remove noises. The output of the differential amplifier 60 is connected to the grid terminal 23 through the resistors Rg1 and Rg2, thereby forming a negative feedback loop.

In this example, a voltage gain of the differential amplifier 60 is calculated by dividing the "sum of resistance values of the resistor R2 and the two combined resistors R1" by the "resistance value of the two combined resistors R1". Therefore, in the case where R1=20 kΩ, R2=1 MΩ, the voltage gain of the differential amplifier 60 becomes (10 k+1 M)÷10 k=101. Since the values of the two resistors R1 are the same, the voltage at the inverting input of the differential amplifier 60 (point A) becomes +2V, which is half of the +4V source voltage. The voltage at the point A, i.e., +2V in this example is a reference voltage to automatically control the output bias voltage of the vacuum tube 20 through the negative feedback loop.

The vacuum tube circuit of FIG. 2 operates as will be explained below. The electrons are released from the cathode terminal 22 which is heated by the heater 25. Since the voltage supplied to the heater 25 is lower than the normal vacuum tube, the amount of heat is small and thus, the amount of emission of the electrons from the cathode terminal 22 is also smaller than the normal case. Further, as noted above, the voltage supplied to the plate terminal 22 is low.

Accordingly, as in an ordinary vacuum tube circuit, if a negative voltage bias is applied to the grid terminal 23, the electrons emitted from the cathode terminal 22 are interfered by the grid terminal 23, making it difficult for them to reach the plate terminal 21. In the embodiment of the present invention, a positive voltage is supplied to the grid terminal 23, hence, a part of the electrons with a negative charge are able to reach the grid 23. Further, the electrons passing through the lattice of the grid 23 are accelerated to reach the plate terminal 21, thereby flowing a plate current through the resistor (RL) 40. As a result of this action, the vacuum tube 20 is able to amplify an input signal from the signal source 10.

The bias control function of the vacuum tube circuit will be explained next. When the voltage at the point B of FIG. 2 (at the non-inverting input terminal of the differential amplifier 60) which is an average voltage of the output terminal 30 created by the integration circuit 65 becomes larger than the voltage +2V supplied to the inverting input terminal of the differential amplifier 60, the output of the differential amplifier 60 becomes positive. As a result, the positive voltage of the grid terminal 23 increases, and thus, the electrons released from the cathode terminal 22 are more easily attracted to the grid 23.

The number of electrons reaching the plate terminal 21 increases due to the acceleration of the electrons passing through the lattice of the grid terminal 23. Accordingly, the plate current Ip flowing through the resistor RL increases, which increases a voltage drop across the resistor RL. Therefore, the voltage at the output terminal 30 as well as the average value thereof at the point B decreases. The voltage decrease continues until the average value at the point B becomes lower than +2V.

Conversely, when the average voltage value of the plate terminal 21 at the point B of the integration circuit 65 becomes smaller than +2V, the output of the differential amplifier 60 becomes negative. As a result, the electrons released from the cathode terminal 22 are not easily attracted by the grid terminal 23. As a result, the number of electrons arriving at the plate terminal 21 through the lattice of the grid terminal 23 decreases, which decreases the plate current Ip. Since the voltage drop across the resistor RL decreases, the voltage of the output terminal 30 as well as the average value thereof (at the output of the integration circuit 65) increases. This voltage increase continues until the average voltage of the output terminal 30 (at the output of the integration circuit 65) becomes greater than +2V. In this manner, the average value of the voltage of output terminal 30 automatically converges to +2V, i.e., the voltage at the inverting input (point A) of the differential amplifier 60.

As a result, as shown by the waveform W1 in FIG. 3, the vacuum tube circuit conducts an automatic bias operation in which the average value of the amplified signal from the output terminal 30 becomes +2V which is half of the source voltage +4V. Hence, by the operation of the bias circuit using the differential amplifier 60 shown in FIG. 2, the average value of the amplified signal from the output terminal 30 becomes constant, thereby achieving an amplified output signal with high stability.

The present invention has been explained above based on the specific embodiments, however, various changes and modifications of the present invention can be possible within the concept of the present invention. For example, in the vacuum tube circuit of FIG. 1, an appropriate capacitor for removing noise can be incorporated. Further, the source voltage does not have to be particularly limited to +4V. For example, the source voltage can be a lower voltage of, for example, +3V to match the battery operation.

As explained above, according to the present invention, the vacuum tube circuit is capable of amplifying an input signal with use of the low source voltage by supplying the low positive voltage to the grid terminal through the resistor while supplying the low voltage to the plate terminal as well as the heater. Since the low source voltage is used, the power consumption by the vacuum tube circuit can be substantially decreased as well as the heat dissipation by the vacuum tube circuit can be decreased, thereby achieving a battery operation, high density mounting, and an increase in reliability.

Although the invention is described herein with reference to the preferred embodiment, one skilled in the art will readily appreciate that various modifications and variations may be made without departing from the spirit and scope of the present invention. Such modifications and variations are considered to be within the purview and scope of the appended claims and their equivalents.

What is claimed is:

1. A vacuum tube circuit for amplifying an input signal, comprising:
    a vacuum tube having a cathode terminal, a plate terminal, and a grid terminal, the cathode terminal being heated by a heater for releasing electrons from the cathode terminal;
    a low source voltage which is supplied to the plate terminal of the vacuum tube and the heater;
    a first grid resistor which is connected between the grid terminal of the vacuum tube and an input signal source thereby creating a voltage drop by a flow of grid current; and
    a positive voltage which supplied to the grid terminal through the grid resistor.

2. A vacuum tube circuit as defined in claim 1, further comprising a plate resistor which is connected to the plate terminal of the vacuum tube, wherein the low source voltage is supplied to the plate terminal through the plate resistor and to the heater.

3. A vacuum tube circuit as defined in claim 1, wherein the positive voltage supplied to the grid terminal of the vacuum tube is produced by dividing the low source voltage by a voltage divider.

4. A vacuum tube circuit as defined in claim 3, wherein the voltage divider is configured by a variable resistor.

5. A vacuum tube circuit as defined in claim 3, further comprising a second grid resistor which is connected between the voltage divider and the first grid resistor.

6. A vacuum tube circuit as defined in claim 1, wherein distortions are created by a characteristic of the vacuum tube and the first grid register to add specific sound effects to an input signal.

7. A vacuum tube circuit for amplifying an input signal, comprising:
    a vacuum tube having a cathode terminal, a plate terminal, and a grid terminal, the cathode terminal being heated by a heater for releasing electrons from the cathode terminal;
    a low source voltage which is supplied to the plate terminal of the vacuum tube and the heater;
    a grid resistor which is connected between the grid terminal of the vacuum tube and an input signal source thereby creating a voltage drop by a flow of grid current;
    a positive voltage which supplied to the grid terminal through the grid resistor; and
    a bias control circuit which controls an output bias voltage of the vacuum tube to a predetermined voltage.

8. A vacuum tube circuit as defined in claim 7, the bias control circuit is configured by a negative feedback loop for automatically controlling the output bias voltage to the predetermined voltage.

9. A vacuum tube circuit as defined in claim 7, the bias control circuit comprising:
    a differential amplifier whose output is connected to the grid terminal of the vacuum tube through the grid resistor; and
    an integration circuit for averaging an output voltage at the plate terminal of the vacuum tube wherein the integration circuit is connected between the plate terminal and the differential amplifier.

10. A vacuum tube circuit as defined in claim 9, the predetermined voltage of the output bias voltage is determined by a reference voltage supplied to an inverting input terminal of the differential amplifier.

11. A vacuum tube circuit as defined in claim 9, the integration circuit provides an average value of the output voltage at the plate terminal to a non-inverting input terminal of the differential amplifier.

12. A vacuum tube circuit as defined in claim 7, further comprising a plate resistor which is connected to the plate terminal of the vacuum tube, wherein the low source voltage is supplied to the plate terminal through the plate resistor and to the heater.

13. A vacuum tube circuit as defined in claim 7, wherein distortions are created by a characteristic of the vacuum tube and the grid register to add specific sound effects to an input signal.

* * * * *